(12) United States Patent
Lin et al.

(10) Patent No.: US 6,210,841 B1
(45) Date of Patent: Apr. 3, 2001

(54) APPROACH TO INCREASE THE RESOLUTION OF DENSE LINE/SPACE PATTERNS FOR 0.18 MICRON AND BELOW DESIGN RULES USING ATTENUATING PHASE SHIFTING MASKS

(75) Inventors: Chia-Hui Lin, Hsin-Chu; Hung Jui Kuo, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/390,784

(22) Filed: Sep. 7, 1999

(51) Int. Cl.[7] .................. G03F 9/00; G03C 5/00
(52) U.S. Cl. ........................... 430/5; 430/311
(58) Field of Search .................. 430/5, 311, 322, 430/324, 22

(56) References Cited

U.S. PATENT DOCUMENTS

| 5,565,286 | 10/1996 | Lin | 430/5 |
|---|---|---|---|
| 5,766,804 | 6/1998 | Spence | 430/5 |
| 5,766,806 | 6/1998 | Spence | 430/5 |
| 5,786,114 | 7/1998 | Hashimoto | 430/5 |
| 5,795,682 | 8/1998 | Garza | 430/5 |
| 5,882,827 | * 3/1999 | Nakao | 430/5 |

* cited by examiner

Primary Examiner—S. Rosasco
(74) Attorney, Agent, or Firm—George O. Saile; Stephen B. Ackerman; Larry Prescott

(57) ABSTRACT

A mask and method of forming a pattern on an integrated circuit wafer having regions of dense line/space patterns and regions of isolated lines or widely spaced line/space patterns. The mask uses a binary mask pattern to form the dense line/space region and an attenuating phase shifting mask pattern to form the isolated line or widely spaced line/space region. Scattering bars are used in the widely spaced line/space region of the mask to improve depth of focus. The method uses the mask in a projection exposure system to expose a layer of photosensitive dielectric on an integrated circuit wafer.

17 Claims, 3 Drawing Sheets

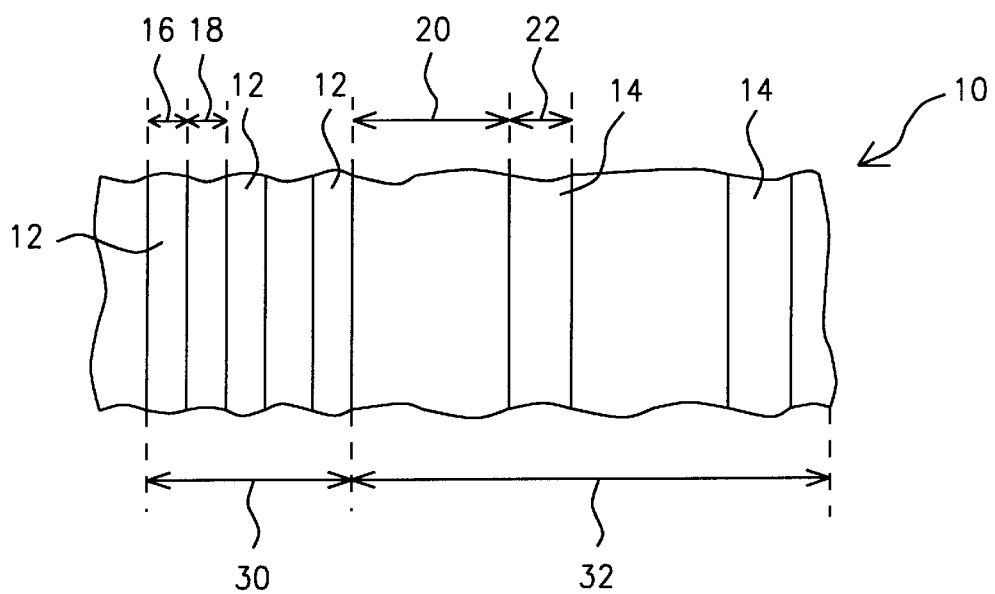
FIG. 1
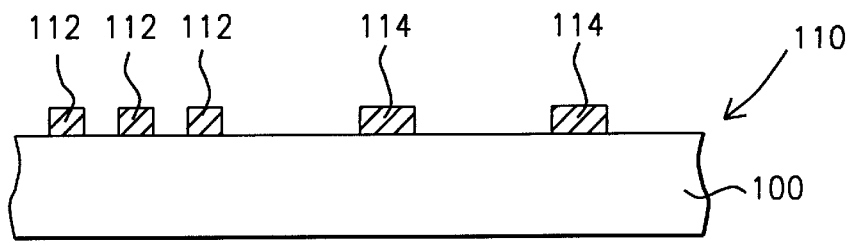
FIG. 2 – Prior Art
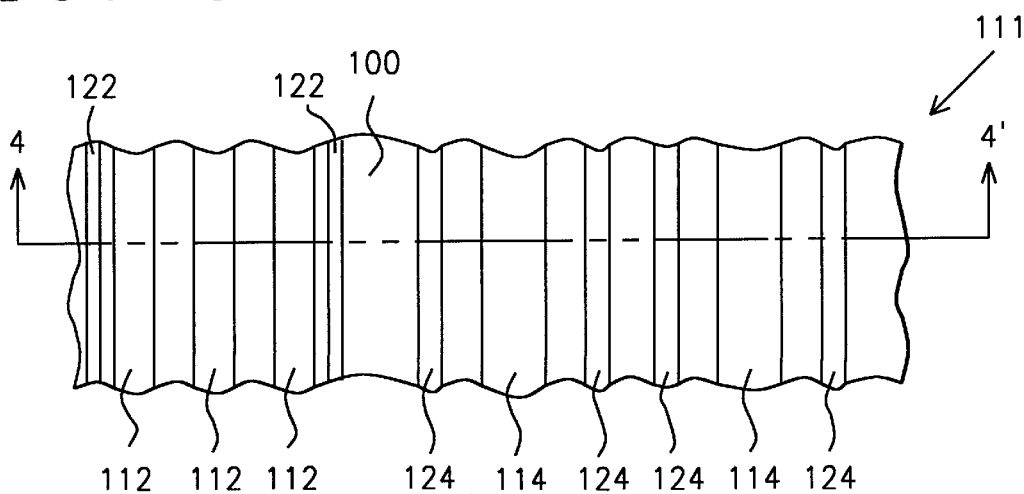
FIG. 3 – Prior Art

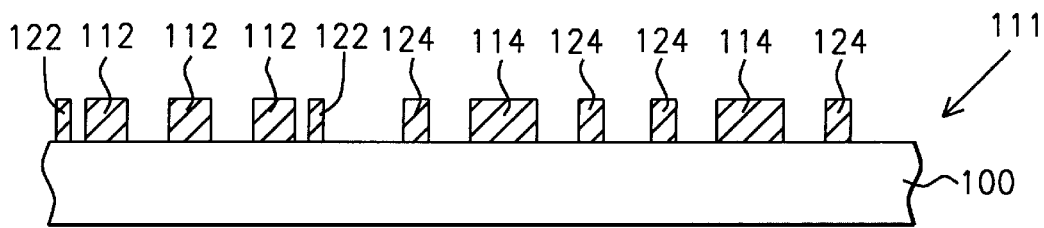
*FIG. 4 - Prior Art*
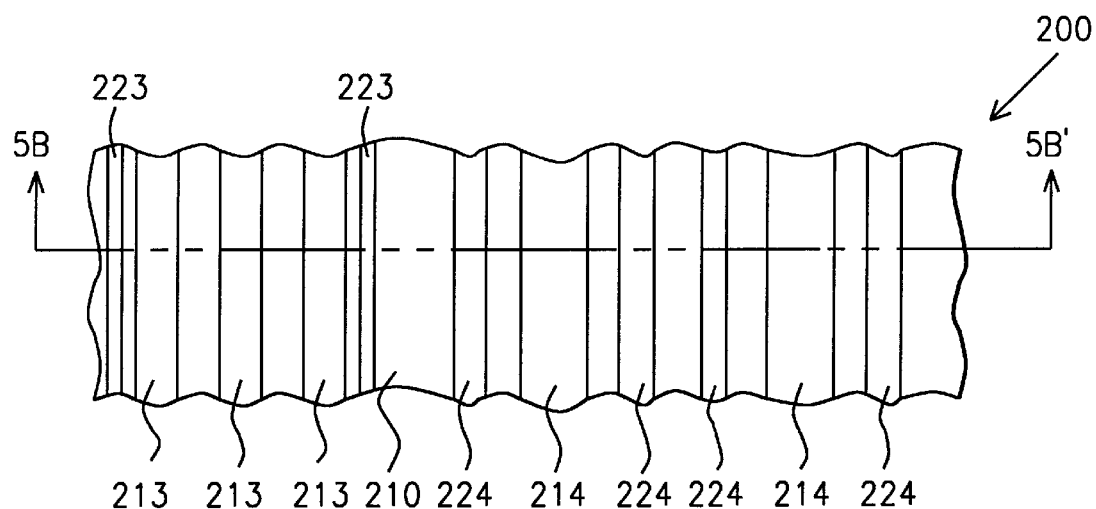
*FIG. 5A*
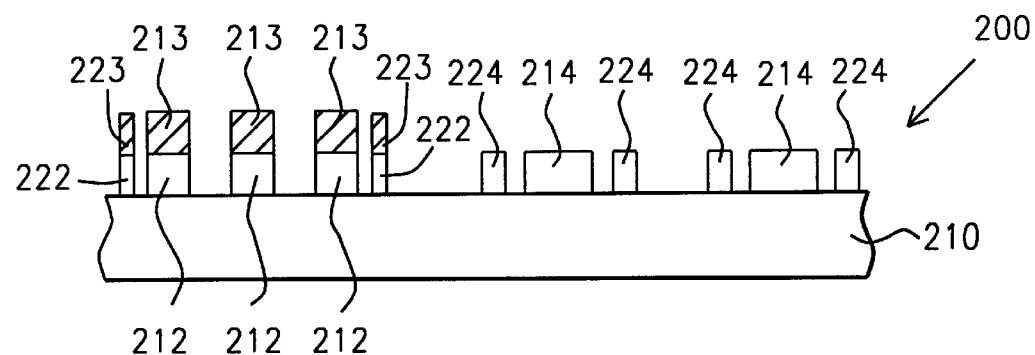
*FIG. 5B*

APPROACH TO INCREASE THE RESOLUTION OF DENSE LINE/SPACE PATTERNS FOR 0.18 MICRON AND BELOW DESIGN RULES USING ATTENUATING PHASE SHIFTING MASKS

BACKGROUND OF THE INVENTION (1) Field of the Invention

This invention relates to attenuating phase shifting masks and the use of attenuating phase shifting masks to achieve increased depth of focus for widely spaced line/space patterns on the same mask as dense line/space patterns.

(2) Description of the Related Art

The depth of focus achieved using binary masks to form parallel line/space patterns is adequate when the density of the line/space patterns is high and the lines are closely spaced. For isolated lines or widely spaced line/space patterns the depth of focus achieved with binary masks is not adequate. Scattering bar patterns can be used in regions having isolated lines or widely spaced line/space patterns but this complicates the fabrication and inspection of the mask.

Attenuating phase shifting masks can be used to improve the depth of focus for isolated lines or widely spaced line/space patterns but dense line/space patterns can not be resolved with attenuating phase shifting masks using a bias even with a very high numerical aperture setting because of the transmittance through the attenuating phase shifting material.

U.S. Pat. No. 5,565,286 to Lin describes a structure and fabrication method for a mask using an attenuating phase shifting mask in combination with an alternating element phase shifting mask.

U.S. Pat. No. 5,786,114 to Hashimoto describes attenuating phase shifting masks with a halftone layer used to form boundary regions such as an inter-chip regions or kerf regions.

U.S. Pat. No. 5,795,682 to Garza describes attenuating phase shifting masks using a compensating transmissive region located where side lobe effects are expected to be most severe.

U.S. Pat. No. 5,766,804 to Spence and U.S. Pat. No. 5,766,806 to Spence describes the use of phase shifting masks showing assignment rules for phase assignment for the phase shift masks.

SUMMARY OF THE INVENTION

FIG. 1 shows a top view of a part of an integrated circuit wafer 10 having a region 30 with a dense line/space pattern and a region 32 having a widely spaced line/space pattern. The lines 12 in the dense line/space pattern region have a width 16 of between about 0.12 and 0.18 micrometers and a duty ratio, the ratio of the width 16 of the lines to the spacing between the lines, of between about 1:1 and 1:1.2. The lines 14 in the widely spaced region have a width 22 of between about 0.13 and 0.18 micrometers and have a duty ratio, the ratio of the width 22 of the lines to the spacing between the lines 20, of 1:X where X is greater than 1.2.

FIG. 2 shows a cross section of a binary mask 110 used to form the pattern shown in FIG. 1 on a wafer. The mask 110 has a number of closely spaced opaque lines 112, formed of chrome or the like, formed on a transparent mask substrate 100 and widely spaced opaque lines 114, also formed of chrome or the like, formed on the transparent mask substrate 100. The mask 110 shown in FIG. 2 will provide good definition for the closely spaced lines but will have inadequate depth of focus for the widely spaced lines.

FIG. 3 shows modifications to the mask shown in FIG. 2 used to provide improved depth of focus when forming the widely spaced lines 14 on the wafer. FIG. 3 shows a top view of the mask Ill having lines 112 in the dense line/space pattern region and lines 114 in the more widely spaced line/space pattern region. To improve the depth of focus, scattering bars 124 are formed on the mask next to the lines 114 in the widely spaced region of the pattern. Scattering bars 122 are also formed at the outer edges of the dense line/space pattern region. The narrow scattering bars, 122 and 124, are located near pattern lines, 112 and 114, and are sufficiently narrow so they will not be printed on the wafer. They are present on the mask and improve the depth of focus for the mask but they are not large enough to form an image on the layer of resist on the wafer corresponding to the scattering bars. The width of the scattering bars projects to between about 0.06 and 0.08 micrometers on the wafer and depends on the critical dimension in the main pattern. The distance between the main pattern and the scattering bars depends on the design rules as well as the parameters of the optical system used to form the image of the mask on a wafer, and is optimized in each case.

FIG. 4 shows a cross section of the mask 111 shown in FIG. 3, taken along line 4–4'of FIG. 3. As can be seen in FIG. 4, the lines 112 in the closely spaced part of the pattern, the lines 114 in the widely spaced part of the pattern, and the scattering bars, 122 and 124, are all formed of opaque material, such as chrome, in the conventional mask. The mask 111 shown in FIGS. 3 and 4 will provide good definition in both the dense region of the wafer and widely spaced region of the wafer but has the disadvantage of complicating both the fabrication of the mask and the inspection of the mask.

Attenuating phase shifting masks can be used to provide good definition in the widely spaced region. Adding attenuating phase shifting scattering bars in the widely spaced part of the pattern provides good depth of focus in the widely spaced part of the pattern. Attenuating phase shifting masks do not give satisfactory results in the densely spaced region of the pattern, however.

It is a principle objective of this invention to provide a mask which can be easily fabricated and inspected which will provide good depth of focus and image contrast for forming images having both dense line/space patterns and isolated lines or widely spaced line/space patterns.

It is another principle objective of this invention to provide a method for forming images having both dense line/space patterns and isolated lines or widely spaced line/space patterns using a mask which can be easily fabricated and inspected.

These objectives are achieved by combining both a binary mask pattern and an attenuating phase shifting mask pattern on the same mask. The binary mask region of the mask is used to form the dense line/space region of the pattern and the attenuating phase shifting mask region of the mask is used to form the isolated line or widely spaced line/space region of the pattern. Scattering bars are used in both the widely spaced line/space region and the dense line/space region.

BRIEF DESCRIPTION OF THE DRAWINGS

FIG. 1 shows a top view of a part of an integrated circuit wafer having a dense line/space region and an isolated or widely spaced line/space region.

FIG. 2 shows a cross section view of a conventional binary mask used to form the pattern shown in FIG. 1.

FIG. 3 shows a top view of a part of a conventional binary mask having scattering bars used to form the pattern shown in FIG. 1.

FIG. 4 shows a cross section view of the part of the conventional binary mask having scattering bars shown in FIG. 3 taken along line 4–4' of FIG. 3.

FIG. 5A shows a top view of a part of the combination binary and attenuating phase shifting mask with scattering bars of this invention used to form the pattern shown in FIG. 1 on a wafer.

FIG. 5B shows a cross section view of the part of the combination binary and attenuating phase shifting mask with scattering bars of this invention used to form the pattern shown in FIG. 1 on a wafer. The cross section is taken along line 5B–5B' of FIG. 5A.

DESCRIPTION OF THE PREFERRED EMBODIMENTS

Figure 6:
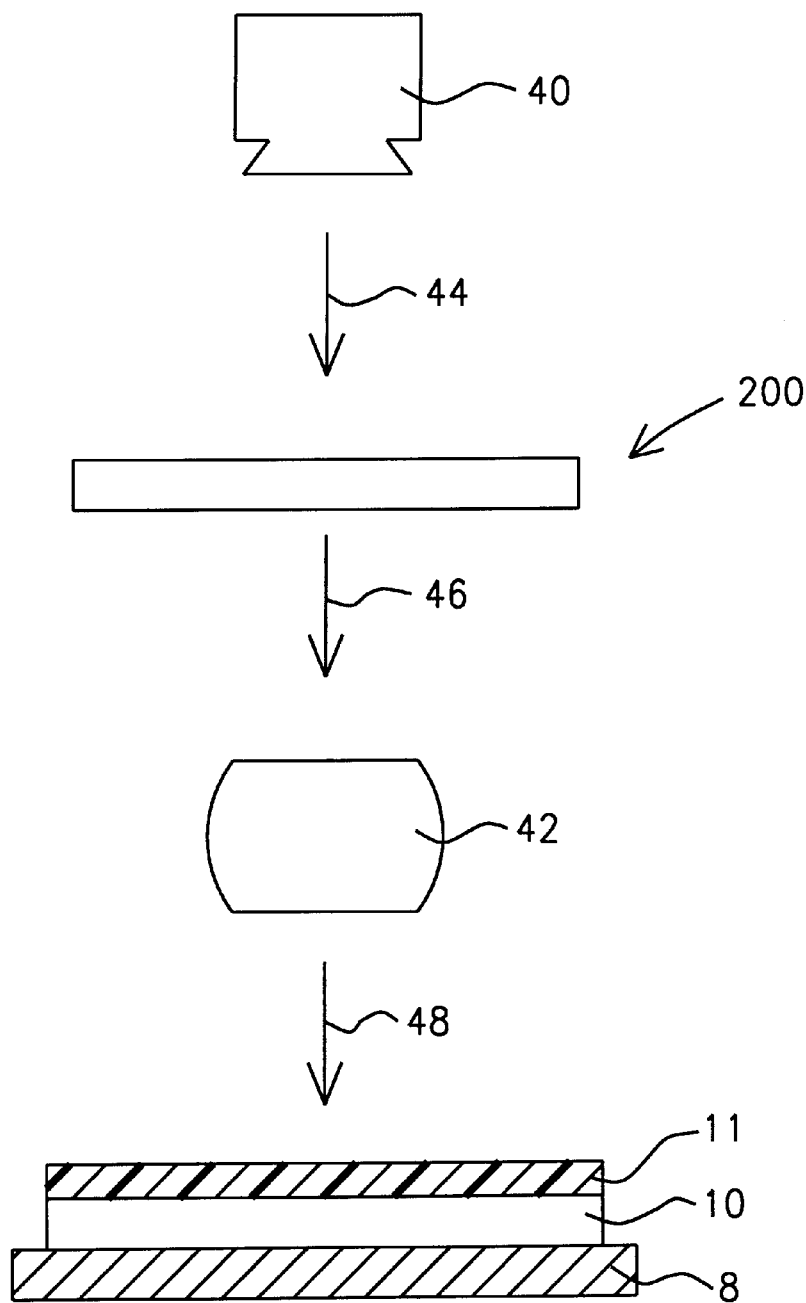
FIG. 6 shows a schematic view of a projection exposure system used to transfer mask images to a wafer.

Refer now to FIGS. 1, 5A, 5B, and 6 for a description of the preferred embodiments of the mask and method of forming images containing both dense and isolated or widely spaced line/space patterns on an integrated circuit wafer. FIG. 1 shows a top view of a part of an integrated circuit wafer 10 having a region 30 with a dense line/space pattern and a region 32 having an isolated or widely spaced line/space pattern. The lines 12 in the dense line/space pattern region have a first line width 16 and a first duty ratio, the ratio of the first line width 16 to the spacing 18 between adjacent lines 12. In this example the first line width is between about 0.12 and 0.18 micrometers and the first duty ratio is between about 1:1 and 1:1.2. The lines 14 in the widely spaced region have a second line width 22 a second duty ratio, the ratio of the second line width 22 to spacing 20 between adjacent lines 14. In this example the second line width is between about 0.13 and 0.18 micrometers and the second duty ratio is 1:X, where X is greater than 1.2.

FIG. 5A shows a top view and FIG. 5B a cross section view of a mask 200 used to form the pattern shown in FIG. 1 on an integrated circuit wafer. FIG. 5B is a cross section of the mask of FIG. 5A taken along line 5B–5B' of FIG. 5A. In order to achieve good depth of focus and image quality in both the dense region of the pattern and the isolated line or widely spaced region of the pattern the mask has both attenuating phase shifting regions and binary regions. As shown in FIGS. 5A and 5B, the mask uses lines 214 formed from attenuating phase shifting material on a transparent mask substrate 210 to form the isolated or widely spaced lines on the wafer. In order to achieve good depth of focus in the widely spaced part of the pattern, scattering bars 224, also formed of attenuating phase shifting material, are formed on the mask next to the widely spaced lines 214. The attenuating phase shifting material is a material such as MoSiON having a thickness of between about 880 and 980 Angstroms. This thickness of attenuating phase shifting material partially transmits light passing through the attenuating phase shifting material and shifts the phase of the light by 180°. The transparent mask substrate 210 is a material such as quartz having a thickness of between about 6.25 and 6.45 millimeters.

As shown in FIGS. 5A and 5B, to form the closely spaced lines on a wafer the mask uses lines 212 formed from the attenuating phase shifting material covered by opaque lines 213 to form a binary region of the mask. Scattering bars formed of narrow lines of attenuating phase shifting material 222 covered by scattering bars of opaque material 223 are formed at the edges of the region of closely spaced lines. The opaque lines 213 are formed of opaque material such as chrome having a thickness of between about 980 and 1120 Angstroms and are formed on top of each of the attenuating phase shifting lines 212 in the closely spaced region of the mask making this region of the mask a binary mask. The opaque scattering bars 223 are also formed from the same opaque material used to form the opaque lines 213. This combines a binary mask pattern, an attenuating phase shifting mask pattern, and scattering bars on the same mask.

Refer to FIGS. 5A, 5B, and 6 for a description of the embodiment of a method of forming images containing both dense and isolated or widely spaced line/space patterns on an integrated circuit wafer. FIG. 6 shows a schematic view of a projection exposure system for exposing an image on an integrated circuit wafer. The projection exposure system comprises a light source, such as an i line source, a deep ultra violet source, or the like, supplying a beam of light 44 to a mask 200. The light 46 passing through the mask 200 then passes through an objective lens 42. The mask 200 is shown in FIGS. 5A and 5B and described in the preceding embodiment and combines a binary mask pattern, an attenuating phase shifting mask pattern, and scattering bars on the same mask.

As shown in FIG. 6, an integrated circuit wafer 10 having a layer of photosensitive dielectric 11, such as photoresist, is placed on a wafer holder 8. The light 48 passing through the objective lens 42 is focussed on the layer of photosensitive dielectric 11 and the layer of photosensitive dielectric is exposed. In this way the mask having both attenuating phase shifting regions and binary regions, shown in FIGS. 5A and 5B, is used to form patterns having a region with dense lines and a region with isolated or widely spaced lines on an integrated circuit wafer. Using the mask having attenuating phase shifting regions, scattering bars, and binary regions good image quality can be achieved over an entire pattern having dense lines and isolated lines in the same pattern.

While the invention has been particularly shown and described with reference to the preferred embodiments thereof, it will be understood by those skilled in the art that various changes in form and details may be made without departing from the spirit and scope of the invention.

What is claimed is:

1. A mask used to form images on an integrated circuit wafer, comprising:

a transparent mask substrate having a first pattern region and a second pattern region;

an opaque first pattern formed on said transparent mask substrate in said first pattern region, wherein said first pattern is formed of opaque material directly over attenuating phase shifting material and comprises a first number of parallel first lines having a first line width and a first duty ratio and wherein said first duty ratio is the ratio of said first line width to the distance between adjacent said first lines;

a second pattern formed from said attenuating phase shifting material on said transparent mask substrate in said second pattern region, wherein said second pattern comprises a second number of parallel second lines having a second line width and a second duty ratio, and said second duty ratio is the ratio of said second line width to the distance between adjacent said second lines; and scattering bars formed from said attenuating phase shifting material in said second pattern region, wherein there is one of said scattering bars on either side of each of said second parallel second lines.

2. The mask of claim 1 wherein said transparent mask substrate is quartz.

3. The mask of claim 1 wherein said attenuating phase shifting material is MoSiON having a thickness of between about 880 and 980 Angstroms.

4. The mask of claim 1 wherein said opaque material is chrome having a thickness of between about 980 and 1150 Angstroms.

5. The mask of claim 1 wherein said first line width is chosen such that the image of said first line width on an integrated circuit wafer is between about 0.12 and 0.18 micrometers.

6. The mask of claim 1 wherein said first duty ratio is between about 1:1 and 1:1.2.

7. The mask of claim 1 wherein said second line width is chosen such that the image of said second line width on an integrated circuit wafer is between about 0.13 and 0.18 micrometers.

8. The mask of claim 1 wherein said second duty ratio is 1:X wherein X is greater than 1.2.

9. A method of forming images on an integrated circuit wafer, comprising:

providing an integrated circuit wafer having a layer of insulating material formed thereon;

providing a projection exposure system;

providing a mask having an opaque first pattern formed on a transparent mask substrate from opaque material formed directly over an attenuating phase shifting material in a first pattern region, and a second pattern formed from said attenuating phase shifting material on said transparent mask substrate in a second pattern region, wherein said first pattern comprises a first number of parallel first lines having a first line width and a first duty ratio, said second pattern comprises a second number of parallel second lines having a second line width and a second duty ratio, said second pattern further comprises scattering bars formed from said attenuating phase shifting material wherein there is one of said scattering bars on either side of each of said second parallel second lines, said first duty ratio is the ratio of said first line width to the distance between adjacent said first lines, and said second duty ratio is the ratio of said second line width to the distance between adjacent said second lines; and forming images of said first pattern and said second pattern on said layer of insulating material using said projection exposure system.

10. The method of claim 9 wherein said transparent mask substrate is quartz.

11. The method of claim 9 wherein said attenuating phase shifting material is MoSiON having a thickness of between about 880 and 980 Angstroms.

12. The method of claim 9 wherein said opaque material is chrome having a thickness of between about 980 and 1120 Angstroms.

13. The method of claim 9 wherein said first distance is chosen such that the image of said first distance on said layer of insulating material is between about 0.12 and 0.18 micrometers.

14. The method of claim 9 wherein said first duty ratio is between about 1:1 and 1:1.2.

15. The method of claim 9 wherein said second distance is chosen such that the image of said second distance on said layer of insulating material is between about 0.13 and 0.18 micrometers.

16. The method of claim 9 wherein said second duty ratio is 1:X wherein X is greater than 1.2.

17. The method of claim 9 wherein said insulating material is photoresist.

* * * * *